(12) United States Patent
Jones et al.

(10) Patent No.: US 6,678,861 B1
(45) Date of Patent: Jan. 13, 2004

(54) FIFO WITH CRC IN A PLD

(75) Inventors: Christopher W. Jones, Pleasanton, CA (US); Michel J. Campmas, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 544 days.

(21) Appl. No.: 09/642,353

(22) Filed: Aug. 21, 2000

(51) Int. Cl.$^7$ .............................................. H03M 13/00
(52) U.S. Cl. ...................................... 714/781; 714/758
(58) Field of Search ................................. 714/807, 781, 714/820, 800, 801, 805, 758

(56) References Cited

U.S. PATENT DOCUMENTS

| | | | | |
|---|---|---|---|---|
| 5,917,841 A | * | 6/1999 | Kodama et al. | ............. 714/807 |
| 6,192,498 B1 | * | 2/2001 | Arato | .......................... 714/781 |
| 6,434,720 B1 | * | 8/2002 | Meyer | .......................... 714/820 |

* cited by examiner

*Primary Examiner*—David Ton
(74) *Attorney, Agent, or Firm*—Christopher P. Maiorana, P.C.

(57) ABSTRACT

A programmable logic device comprising one or more memory circuits configured to check a cyclic redundancy check (CRC) value of an input and generate a CRC for an output.

20 Claims, 3 Drawing Sheets

FIFO WITH CRC IN A PLD

FIELD OF THE INVENTION

The present invention relates to a method and/or architecture for cyclic redundancy checking (CRC) generally and, more particularly, to a method and/or architecture for a FIFO with cyclic redundancy checking (CRC) in a programmable logic device (PLD).

BACKGROUND OF THE INVENTION

The trend in networking applications is to rely more and more on specialized hardware logic to process network data frames for increased throughput. Traditional discrete logic and custom application specific integrated circuit (ASIC) approaches are steadily being displaced by new complex programmable logic devices (CPLDs). The CPLDs can offer flexible solutions and fast time to market.

A cyclic redundancy check (CRC) is used to detect transmission errors over communication channels in digital systems. When using the CRC technique, a modulo-2 sum (i.e., a CRC-sum) of bits of a message is calculated after grouping the message bits. The CRC-sum is appended to the transmitted message and used by the receiver to determine if the message was received correctly. The CRC-sum can be 8 or 16 bits, depending on the length of the message and the desired error-detection capability.

In one example, the CRC technique uses a polynomial expression to encode a message to be transmitted. An m-bit message $M(x)$, where m is an integer, may be represented by a polynomial of order m−1. A polynomial $C(x)$ of order c−1 can be used to encode the message $M(x)$. An encoding expression $R(x)$ can be calculated according to the equation $R(x)=(x^c M(x))/C(x)$. The transmitted message $T(x)$ can be formed by the following equation $T(x)=(x^c M(x)) \oplus R(x)$. The transmitted message $T(x)$ is exactly divisible by the encoding polynomial $C(x)$. The receiver can determine if errors are present using the encoding polynomial. The receiver calculates $(T(x)+E(x))/C(x)$, where $E(x)$ represents any errors introduced during transmission. If the result is not zero, $E(x)$ is non-zero and the received message is erroneous. If the result is zero, either no errors were introduced or $E(x)$ is such that the CRC is not strong enough to detect the error. A suitable choice of the polynomial $C(x)$ can ensure detection of errors.

Three methods of implementing CRC checking/generation for frame processing in networking applications are currently used. In a first method, CRC checking and generation logic is designed using the general purpose logic and routing resources available in a programmable logic device (PLD) with integrated FIFO blocks. However, the use of general purpose complex programmable logic device/field programmable gate array (CPLD/FPGA) cells and routing leads to (1) reduced performances due to the interconnect delays and (2) inefficient use of silicon real estate as the CRC components (divider, shifter, comparator, etc.) are implemented using general purpose look-up-table (LUT) or product term logic and interconnect resources.

A second method uses an ASIC with CRC checking and generation implemented via gate-array or standard cell logic. Using the ASIC approach leads to better performance than the first method. However, the nonrecurring engineering (NRE) costs and long turnaround time for ASICs can be detrimental to the fast time to market and short product lifetime that are typical in networking applications.

A third method using off the shelf FIFOs and CRC generator chips assembled onto a PC board can significantly improve performance. However, using off the shelf FIFOs and CRC generator chips assembled onto a PC board can be more expensive, uses precious board real estate, consumes more power, and is less reliable due to the large component count.

A CPLD having integrated FIFOs to buffer frame data and high-performance, integrated CRC checking and generating blocks at the input and output of the FIFOs would be desirable. Such a CPLD may ease the transition to processing data frames in hardware while providing a throughput similar to traditional ASIC solutions.

SUMMARY OF THE INVENTION

The present invention concerns a programmable logic device comprising one or more memory blocks that may be configured to check a CRC of an input and generate a CRC for an output.

The objects, features and advantages of the present invention include providing a method and/or architecture for implementing a FIFO with cyclic redundancy checking (CRC) in a programmable logic device (PLD) that may (i) provide PLD users with high performance custom building blocks to check and recompute data frame CRCs as they are switched, buffered and processed by user-specific logic designed using the PLD general purpose logic, (ii) provide logic for checking and generating data frame CRCs on the fly while maintaining a high throughput, (iii) provide application flexibility, (iv) guarantee performance of custom logic, (v) have low power consumption, (vi) require less silicon real estate than conventional CRC methods, and/or (vii) ease the transition to processing data frames in hardware while providing a throughput similar to traditional ASIC solutions.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
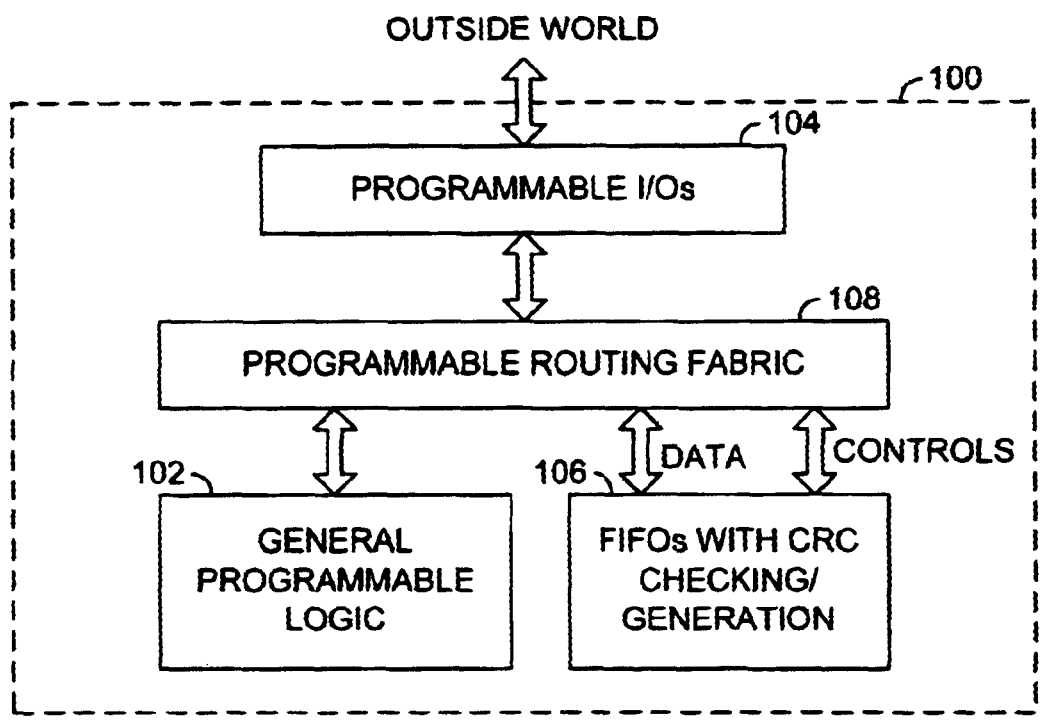
FIG. 1 is a block diagram illustrating a preferred embodiment of the present invention.

Referring to FIG. 1, a block diagram of a circuit 100 is shown in accordance with a preferred embodiment of the present invention. The circuit 100 may be, in one example, a programmable logic device (PLD) configured to provide CRC checking at an input side of an integrated FIFO block and CRC generation at an output side of the same FIFO block. The FIFO block may comprise parameterizable custom logic that may perform the CRC checking and generation. The present invention may allow for higher throughput, application flexibility, and reduced silicon real estate in networking applications using programmable logic devices and requiring real time CRC checking and generation for frame processing.

The circuit 100 may comprise one or more blocks of general-purpose programmable logic 102, one or more banks of programmable input/outputs (I/Os) 104, one or more configurable memory blocks with CRC checking and generation logic 106, and a programmable routing fabric 108. The blocks 102 may be used to implement user specified customized logic. The I/O banks 104 may be implemented to communicate with the world outside the PLD (e.g., receive and transmit data frames). The memory blocks 106 may be implemented, in one example, as distributed memory that may be cascaded to form larger blocks. The memory blocks 106 may be configured, in one example, as FIFO memory blocks with CRC checking and generation logic. However, other memory configurations may be implemented accordingly to meet the design criteria of a particular application. The programmable routing fabric 108 may be configured to connect the general-purpose logic blocks 102, the I/O blocks 104, and the memory blocks with CRC checking and generation 106 to each other.

The block 102 may comprise, in one example, clusters of look-up-tables (LUTs) or product term logic cells. The programmable I/Os 104 may be, in one example, standard TTL-level I/Os or high performance serial I/Os. The communication between the memory block with CRC checking/generation 106 and the other portions of the PLD 100 may include frame data busses (e.g., in and out), control signals, and initialization data (e.g., CRC polynomial coefficients).

Figure 2:
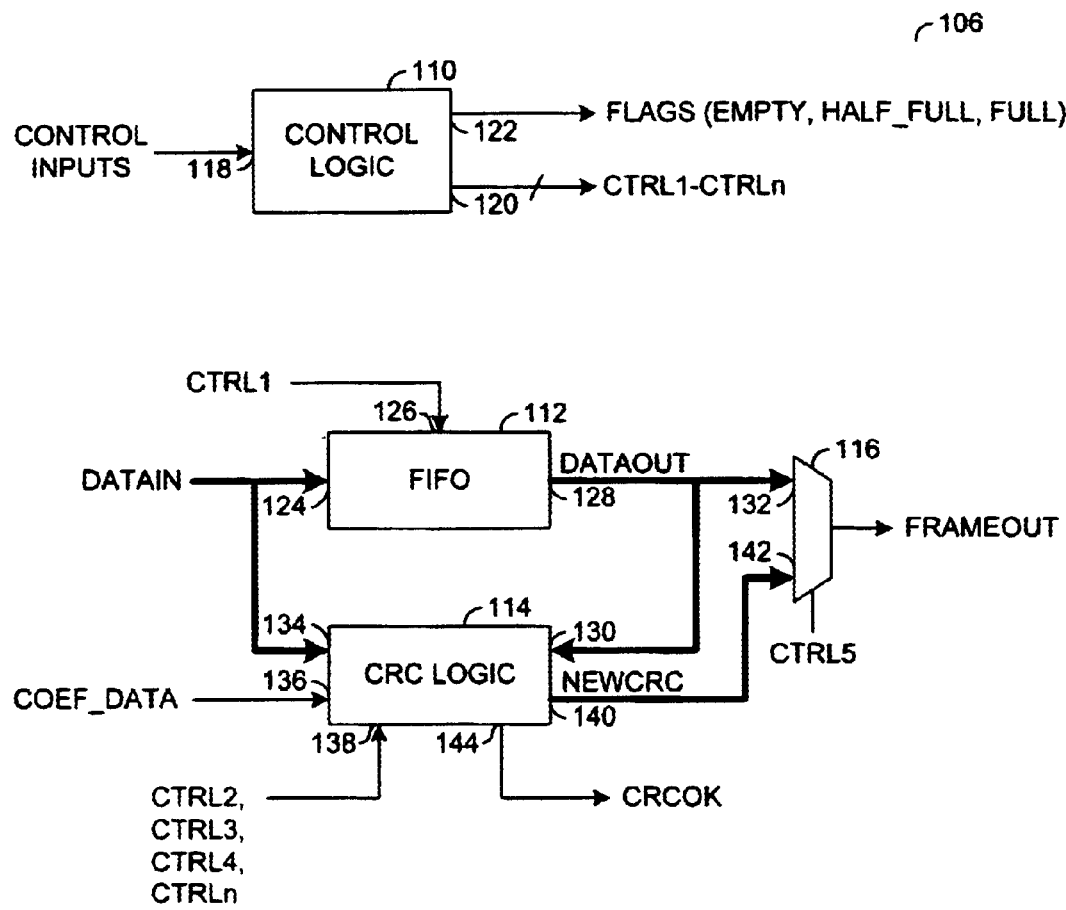
FIG. 2 is a detailed block diagram illustrating a preferred embodiment of the present invention.

Referring to FIG. 2, a detailed block diagram illustrating a circuit 106 of FIG. 1 configured as a FIFO with CRC checking/generation logic in accordance with the present invention is shown. In one example, the circuit 100 may comprise a number of the circuits 106 (e.g., distributed FIFO memory). The number of circuits 106 may allow the simultaneous processing of multiple data frame queues. As used herein, the term simultaneous is meant to describe events that share some common time period. However, the term is not meant to be limited to events that begin at the same point in time, end at the same point in time or have the same duration. The circuit 106 may comprise, in one example, a circuit 110, a circuit 112, a circuit 114, and a multiplexer 116.

The circuit 110 may be implemented, in one example, as a control logic block. The circuit 110 may be configured to generate a first set of signals (e.g., CTRL1, CTRL2, . . . CTRLn) and a second set of signals (e.g., FLAGS). The first set of signals CTRL1-CTRLn may comprise, in one example, a number of individual control signals, a number of sets of individual control signals, and/or a number of single or multi-bit control signals. The second set of signals may be, in one example, used as FIFO flags (e.g., empty, half-full, full, etc.).

The circuit 110 may have an input 118 that may receive a number of signals (e.g., control inputs) from the programmable routing fabric 108, an output 120 that may present the signals CRTL1-CTRLn, and an output 122 that may present the set of signals FLAGS. The control,inputs to the circuit 110 may be generated, in one example, by user specified logic implemented in the general programmable logic 102.

The circuit 112 may be configured, in one example, as a FIFO. The circuit 112 may be, in one example, used for buffering data frames. The circuit 112 may have an input 124 that may receive a signal (e.g., DATAIN), an input 126 that may receive the signal(s) CTRL1, and an output that may present a signal (e.g.,DATAOUT) to an input 130 of the circuit 114 and an input 132 of the multiplexer 116. The signal DATAIN may comprise, in one example, one or more input data frames that may include a CRC value. The signal DATAIN may be received, in one example, from the programmable routing fabric 108 via an input bus connected to the circuit 106. The signal DATAOUT may comprise, in one example, one or more output data frames that also may include a CRC value. The signal (s) CTRL1 may be used, in one example, to control reading and writing operations of the circuit 112.

The circuit 114 may be implemented, in one example, as a CRC logic circuit. The circuit 114 may be configured to perform CRC checking on the signal DATAIN and CRC generation for the signal DATAOUT. The circuit 114 may have (i) an input 134 that may receive the signal DATAIN, (ii) an input 136 that may receive a signal (e.g., COEF_DATA), (iii) an input 138 that may receive the signals CTRL2, CTRL3, CTRL4, and CTRLn, (iv) an output 140 that may present a signal (e.g., NEWCRC) to an input 142 of the multiplexer 116, and (v) an output 144 that may present a signal (e.g., CRCOK)

The signal CRCOK may indicate, in one example, that the signal DATAIN is generally without errors. In one example, the signal CRCOK may be;used to control the circuit 112 in response to a failure of the CRC check of the signal DATAIN.

The signal NEWCRC may be, in one example, a generated CRC for a data portion of the signal DATAOUT. In one example, when a data portion of a data frame stored in the circuit 112 has changed (e.g., by an operation of user specified logic in the block 102), a new CRC will generally need to be generated. Generating a new CRC when a data portion of a stored data frame is altered may facilitate detection and localization of transmission errors in a communications network.

The signal COEF_DATA may comprise, in one example, configuration data that may be used to control the CRC checking and generation logic 114. In one example, the signal COEF_DATA may comprise coefficients of one or more polynomial expressions. The polynomial expressions may be used by the CRC logic 114 to check and generate CRCs.

The multiplexer 116 may receive the signal(s) CTRL5 at a control input and may present the signal FRAMEOUT at an output. The signal FRAMEOUT may comprise the data portion of the signal DATAOUT and the generated CRC value NEWCRC.

Figure 3:
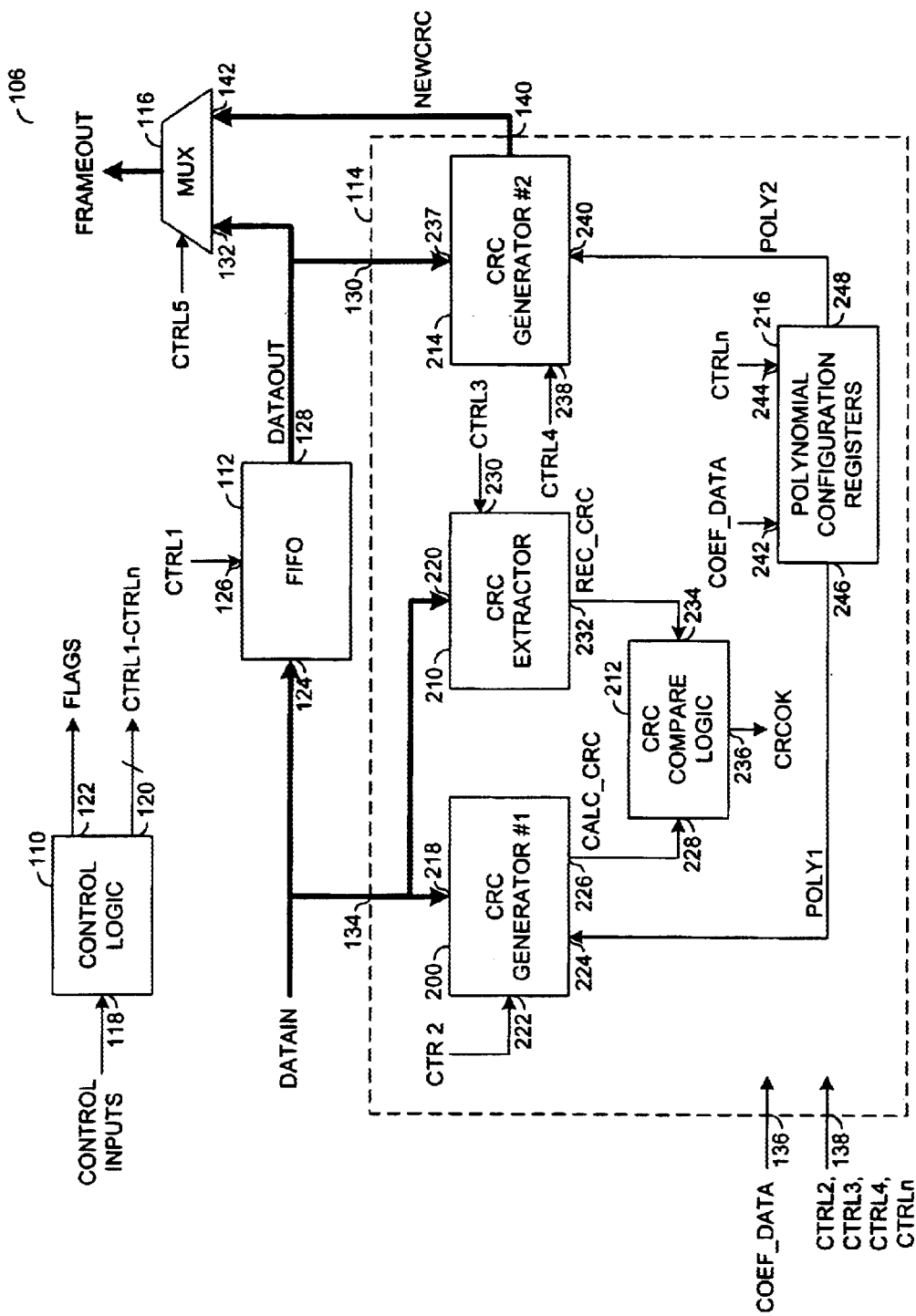
FIG. 3 is a more detailed block diagram illustrating a preferred embodiment of a CRC logic block of FIG. 2.

Referring to FIG. 3, a more detailed block diagram illustrating the CRC logic 114 of FIG. 2 is shown. The circuit 114 may comprise, in one example, a circuit 200, a circuit 210, a circuit 212, a circuit 214 and a circuit 216. The circuit 200 may be implemented, in one example, as a CRC generator circuit. The circuit 210 may be implemented, in one example, as a CRC extractor circuit. The circuit 212 may be implemented, in one example, as a CRC comparator logic circuit. The circuit 214 may be implemented, in one example, as a CRC generator circuit. The circuit 216 may be implemented, in one example, as one or more registers.

The signal DATAIN may be presented to an input 218 of the circuit 200 and an input 220 of the circuit 210. The circuit 200 may have an input 222 that may receive the signal(s) CTRL2, an input 224 that may receive an input (e.g., POLY1), and an output 226 that may present a signal (e.g., CALC_CRC). The input POLY1 may be implemented, in one example, as a configuration signal. The input POLY1 may be used to configure the CRC generator circuit 200. In one example, the input POLY1 may comprise coefficients of a polynomial expression that may be used to generate a CRC. The signal CALC_CRC may be a CRC value calculated in response to a data portion of the signal DATAIN, the input POLY1, and the control input CTRL2.

The circuit 210 may have an input 230 that may receive the control input CTRL3 and an output 232 that may present a signal (e.g., REC_CRC) to an input 234 of the circuit 212. The signal REC_CRC may represent, in one example, a CRC value contained in the signal DATAIN. The circuit 210 may be configured to extract the CRC value REC_CRC from the signal DATAIN in response to the control input CTRL3.

The circuit 212 may have an output 236 that may present the signal CRCOK. The circuit 212 may be configured, in one example, to generate the signal CRCOK in response to a comparison of the signals CALC_CRC and REC_CRC. The signal CRCOK may be generated having (i) a first predetermined state when the signals CALC_CRC and REC_CRC match and (ii) a second predetermined state when the signals CALC_CRC and REC_CRC do not match.

The signal DATAOUT may be presented to an input 237 of the circuit 214. The circuit 214 may have an input 238 that may receive the control input CTRL4 and an input 240 that may receive an input (e.g., POLY2). The input POLY2 may be implemented, in one example, as a configuration signal. The input POLY2 may be used to configure the CRC generator circuit 214. In one example, the input POLY2 may comprise coefficients of a polynomial expression that may be used to generate a CRC. The circuit 214 may be configured to generate the signal NEWCRC in response to the inputs DATAOUT, CTRL4, and POLY2.

The circuit 216 may have an input 242 that may receive the input COEF_DATA, an input 244 that may receive the control input CTRLn, an output 246 that may present the signal(s) POLY1, and an output 248 that may present the signal(s) POLY2. The signals POLY1 and POLY2 may be the same or different. When the signals POLY1 and POLY2 are different, the CRC checking operation will generally be in response to a first polynomial expression and the CRC generation operation will generally be in response to a second polynomial expression. The signals POLY1 and POLY2 may be configured in response to the signals COEF_DATA and CTRLn.

The circuit 200 may be configured to compute the CRC of the incoming frame being written into the FIFO 112 and is generally controlled by the control input CTRL2. The control input CTRL2 may indicate when to start and stop computing the CRC of the incoming frame. The circuit 210 generally extracts the CRC value stored in the incoming frame. The circuit 210 is generally controlled by the control input CRTL3. The control input CTRL3 may be configured to indicate when to start and stop reading the CRC in the incoming frame.

The circuit 214 generally computes the CRC NEWCRC of the outgoing frame being read from the FIFO 112. The circuit 214 is generally controlled by the control input CTRL4. The control input CTRL4 may indicate when to start and stop computing the CRC NEWCRC of the outgoing frame. The computed CRC NEWCRC may be multiplexed with the signal DATAOUT to generate the outgoing frame FRAMEOUT. The control input CTRL5 may indicate when the CRC NEWCRC is to be substituted into the frame.

The polynomial configuration registers 216 may hold one or more coefficient values that may be used for CRC generation. The registers 216 may provide the coefficients, to the circuit 200 and the circuit 214. The control input CTRLn may be used to initially configure (e.g., load) the registers 216 from the input COEF_DATA.

The present invention may provide PLD users with high performance custom building blocks that may check and recompute data frame CRCs as the frames are switched, buffered and processed by user-specified logic designed using the PLD general purpose logic blocks 102.

The present invention may provide a PLD architecture that may have specialized logic for checking and generating data frame CRCs on the fly with a high throughput. In the present invention, custom generators and checkers, control signals, and one or more configurable polynomials may be used for CRC processing to offer the best trade-off in terms of application flexibility, guaranteed performance of custom logic, low power consumption and reduced silicon real estate.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:
   one or more memory circuits each configured to (i) receive an input and (ii) present a first output;
   one or more logic circuits each configured to (i) receive said input and said first output and (ii) present a second output; and
   a multiplexer configured to select said first output or said second output in response to a first control input, wherein said one or more logic circuits are configured to check a first cyclic redundancy check (CRC) value of said input and generate a second CRC value for said first output.

2. The programmable logic device according to claim 1, wherein said memory circuits are configurable memory circuits.

3. The programmable logic device according to claim 2, wherein said memory circuits are configured as first in first out (FIFO) memory circuits.

4. The programmable logic device according to claim 1, wherein said first CRC value is according to a first polynomial and said second CRC value is generated according to a second polynomial.

5. The programmable logic device according to claim 4, wherein said first and second polynomials are configured in response to coefficients contained in one or more registers.

6. The programmable logic device according to claim 5, wherein said contents of said one or more registers are user programmable.

7. The programmable logic device according to claim 1, wherein said one or more logic circuits further comprise a CRC generator circuit configured to generate said first CRC value in response to a data portion of said input and a second control input.

8. The programmable logic device according to claim 1, wherein each of said one or more logic circuits further comprises a CRC generator circuit configured to generate said second CRC value in response to a data portion of said first output and a second control input.

9. The apparatus according to claim 1, wherein said second circuit comprises:
   a first CRC generator configured to generate a first CRC value in response to a data portion of said input;
   a second CRC generator configured to generate a second CRC value in response to a data portion of said first output;
   a CRC extractor circuit configured to extract a third CRC value from said input;
   a compare circuit configured to generate a signal in response to said first CRC value and said third CRC value; and one or more polynomial configuration registers configured to control said first and said second CRC generators.

10. A method for implementing a FIFO with CRC in a programmable logic device comprising the steps of:

(A) storing an input frame of data into said FIFO; and (B) checking a CRC value of said input frame of data and generating a signal indicating an error condition of said input frame of data.

11. The method according to claim 10, wherein the step (B) comprises the sub-steps of:

(B-1) receiving said input frame of data;

(B-2) calculating a first CRC for a data portion of said input frame of data;

(B-3) extracting a second CRC from said input frame of data; and (B-4) comparing said first and second CRCs.

12. The method according to claim 11, wherein the sub-step (B-2) is performed using a polynomial.

13. The method according to claim 12, wherein said polynomial comprises one or more user configured coefficients.

14. The method according to claim 13, wherein said user configured coefficients of said polynomial are stored in one or more registers.

15. The method according to claim 10, further comprising the steps of:

(C) retrieving a frame of data from said FIFO; and (D) generating an output frame of data, wherein said output frame of data comprises said frame of data from said FIFO multiplexed with a CRC value generated in response to said frame of data from said FIFO.

16. A method for implementing a FIFO with CRC in a programmable logic device comprising the steps of:

(A) retrieving a frame of data from said FIFO;

(B) generating a CRC value for said frame of data from said FIFO, wherein said frame of data from said FIFO and said CRC value are multiplexed in response to a control input.

17. The method according to claim 16, wherein step (B) comprises the sub-steps of:

(B-1) receiving a data portion of said retrieved frame of data;

(B-2) calculating a CRC for said data portion; and (B-3) appending said calculated CRC to said data portion to form an output frame of data.

18. The method according to claim 17, wherein the sub-step (B-2) is performed using a polynomial.

19. The method according to claim 18, wherein said polynomial comprises one or more user configured coefficients.

20. The method according to claim 19, wherein said user configured coefficients of said polynomial are stored in one or more registers.

* * * * *